United States Patent
Cheng et al.

(10) Patent No.: US 6,984,546 B2
(45) Date of Patent: Jan. 10, 2006

(54) METHOD FOR FORMING A THIN FILM LIGHT EMITTING DEVICE

(75) Inventors: Chen Lai Cheng, Hsinchu (TW); Tseng Chiu Fen, Hsin-Cheng Hsiang (TW); Jui-Fen Pai, Nantou (TW); Yi-Hung Chou, Hsinchu (TW); Yung-Yuan Chen, Kaohsiung (TW); Ping-Song Wang, Pan-Chiao (TW)

(73) Assignee: Delta Optoelectronics, Inc., Hsinchu (TW)

( * ) Notice: Subject to any disclaimer, the term of this patent is extended or adjusted under 35 U.S.C. 154(b) by 266 days.

(21) Appl. No.: 09/849,457

(22) Filed: May 4, 2001

(65) Prior Publication Data

US 2002/0132384 A1    Sep. 19, 2002

(30) Foreign Application Priority Data

Mar. 15, 2001  (TW) .............................. 90106034 A

(51) Int. Cl.
  *H01L 21/44*  (2006.01)
  *H01L 21/48*  (2006.01)
  *H01L 21/50*  (2006.01)
(52) U.S. Cl. ...................... 438/125; 438/126; 438/127; 428/69
(58) Field of Classification Search ............ 438/22–24, 438/35, 99, 29, 25, 26, 51, 55, 64, 106, 118, 438/121, 124–127; 428/69, 76, 690, 917
See application file for complete search history.

(56) References Cited

U.S. PATENT DOCUMENTS

| | | | |
|---|---|---|---|
| 6,175,186 B1 * | 1/2001 | Matsuura et al. | ............ 313/483 |
| 6,284,342 B1 * | 9/2001 | Ebisawa et al. | .............. 428/69 |
| 6,285,039 B1 * | 9/2001 | Kobori et al. | ................ 257/40 |
| 6,468,819 B1 * | 10/2002 | Kim et al. | .................... 438/22 |
| 6,538,375 B1 * | 3/2003 | Duggal et al. | .............. 313/506 |
| 6,724,150 B2 * | 4/2004 | Maruyama et al. | ...... 315/169.3 |
| 2002/0033664 A1 * | 3/2002 | Kobayashi | .................. 313/504 |

* cited by examiner

*Primary Examiner*—Mary Wilczewski
*Assistant Examiner*—Khanh Duong
(74) *Attorney, Agent, or Firm*—J.C. Patents

(57) ABSTRACT

A method is to form a thin film light emitting device. The method includes providing a transparent substrate. A transparent anode layer, a light emitting layer, a metal cathode layer are sequentially formed on the transparent substrate. A sealant layer is formed to at least cover the light emitting layer and the metal cathode layer. A covering layer having a covering surface is provided. An evaporation process is performed to form an active absorption layer on the covering surface of the covering layer. The covering surface of the covering layer covers on a portion of the sealant layer above the metal cathode layer. The covering layer can have a recess region that is to be formed the active absorption layer thereon. Alternatively, the active absorption layer can be evaporated before the sealant is formed. Moreover, the active absorption layer can be replaced with an insulating layer.

15 Claims, 5 Drawing Sheets

METHOD FOR FORMING A THIN FILM LIGHT EMITTING DEVICE

CROSS REFERENCE TO RELATED APPLICATION

This application claims the priority benefit of Taiwan application serial no. 90106034, filed on Mar. 15, 2001.

BACKGROUND OF THE INVENTION

1. Field of the Invention

The present invention relates to optoelectronics fabrication. Particularly, the present invention relates to a method for fabricating a thin film light emitting device, having a metal cathode with anti-oxidization function.

2. Description of the Related Art

The current optoelectronics technology has been successfully developed. The light emitting diode (LED) is one usual product of the optoelectronical devices. The light emitting diode can emit light when is applied with a bias. Thereby, the light emitting diode, associating with circuit design, can be incorporated in a display device, or providing as a light source. The light emitting diode has very wide applications.

In general, LED can be characterized into two types. One type is metal semiconductor LED and the other type is organic LED. The organic LED can further divided into two types. One is small molecular weight LED and the other one is polymer LED. The basic operations of these LED is that when a voltage of 2 volts to 10 volts is applied on the two electrodes, the organic LED then emitting light.

The mechanism for the organic LED to emit light is due to recombination of electrons and holes in the organic material. As electrons and holes recombine, energy is released in form of light. Usually, when a voltage is applied on the organic light emitting material, a ground state of the organic light emitting material transits to an excited state. At this condition, the organic light emitting material is at an unstable state and will fall back to the ground state from the excited state. At this moment, the electrons and the holes recombine and photons radiate out.

The brightness of the organic LED has strong dependency one the transmitted energy by the electrons and the holes. When the number of pairs of the electrons and holes for recombination is larger, the light brightness is higher accordingly. Theoretically, the organic light emitting material is a kind of organic semiconductor, the transit energy of the electron-hole pair is affected by the energy band of any contact material. For the cathode, electrons are transmitted from the metal cathode to the organic light emitting material. If the energy band between the cathode material and the organic light emitting material is larger, electrons are more difficult to transit to the organic light emitting material. Therefore, the metal material having smaller working function, such as Mg, Li, or Ca, is useful to reduce the energy band gap between the metal cathode and the organic light emitting material. As a result, the metal with small working function is helpful for transiting electrons to the organic light emitting material. This also means that the light emitting device has higher emitting efficiency.

FIG. 1 is a schematic drawing, illustrating a typical structure for an LED. In FIG. 1, there is a transparent substrate 50. A transparent anode layer 52, such as indium tin oxide (ITO), is formed on the substrate 50 thereon. An LED material layer 54 is formed on the transparent anode layer 52. A metal cathode layer 56 is formed on the LED material layer 54. When a voltage is applied on the LED material layer 54, the lights 58 are emitted through the transparent substrate.

The metal cathode 56 usually includes a metal material with low working function, such as Ma, Li, or Ca, which metal materials basically are categorized as active metal. The active material is very easy to react with water or oxygen, resulting in degrading of performance of the metal cathode. Currently, the metal cathode of LED is usually made of active metal with low working function. Due to the active properties of the metal, the lifetime of production strongly depends on the amount of water or oxygen contained by the device. If the water or oxygen contained by the device is high, water and oxygen do react with the active metal cathode 56, causing the failure of the device. In order to ensure that the metal cathode is not eroded by water and oxygen, it needs a reliable package manner to package the device, so as to prevent the device from being eroded by water and oxygen.

Basically, the structure of device after packaging is shown in FIG. 2. After the metal cathode is accomplished, a sealant layer 60 is formed to cover a transparent anode 52, the LED material layer 54, and the metal cathode layer 56. Then, a cap layer 62 covers a portion of the sealant 60 above the metal cathode 56.

In order to solve the erosion of water and oxygen on metal cathode layer 56, the prior technology may add one additional material layer to reduce the reaction of the metal cathode with water and oxygen. However, the efficiency is still poor, or the method is more complicate.

SUMMARY OF THE INVENTION

The invention provides a method for forming a thin film LED device. The method includes forming an active absorbing layer located on the cap layer of the LED device through vacuum evaporation manner. As the cap layer covers the LED device, the active absorbing layer can absorb invading water and oxygen. Consequently, water or oxygen has lower possibility to react with a metal cathode, and lifetime of device thereby can be effectively raised.

The invention provides a method for forming a thin film light emitting device by adding an insulating layer on the metal electrode before the device is packaged, so that the reaction between the metal cathode and water/oxygen is effectively reduced.

The invention provides a method for forming a thin film light emitting device. The method includes providing a transparent substrate. A transparent anode layer, a light emitting layer, a metal cathode layer are sequentially formed on the transparent substrate. A sealant layer is formed to at least cover the light emitting layer and the metal cathode layer. A covering layer having a covering surface is provided. An evaporation process is performed to form an active absorption layer on the covering surface of the covering layer. The covering surface of the covering layer covers on a portion of the sealant layer above the metal cathode layer.

In the foregoing step of providing the covering layer, the covering layer includes a cap-like layer to completely cover over the sealant layer, the transparent anode layer, light emitting layer, and the metal cathode layer.

In the foregoing, before the step of performing the evaporation process, the invention further includes forming a recess region on the covering surface of the covering layer, whereby the active absorption layer is formed on a recessed surface of the recess region.

In the foregoing, the metal cathode includes Ca, Mg, or Li.

In the foregoing, the active absorption layer includes Ca, Mg, or Li.

The invention also provides another method for forming a thin film light emitting device. The method includes providing a transparent substrate. A transparent anode layer, a light emitting layer, a metal cathode layer are sequentially formed on the transparent substrate. An evaporation process is performed to form an active absorption layer at least covering the metal cathode layer. A sealant layer is formed at least covering the active absorption layer, the light emitting layer, and the metal cathode. A covering layer having a covering surface is provided. An evaporation process is performed to form an active absorption layer on the covering surface of the covering layer. A covering layer having a covering is provided. The covering surface of the covering layer covers on a portion of the sealant layer above the metal cathode layer.

The active absorption layer of the invention can effectively absorb invading oxygen or water, thereby the probability of reaction between metal cathode and water/oxygen is greatly reduced. The lifetime of product is then greatly prolonged.

The invention also provides another method for forming a thin film light emitting device. The method includes providing a transparent substrate. A transparent anode layer, a light emitting layer, a metal cathode layer are sequentially formed on the transparent substrate. An insulating layer is formed above the metal cathode layer. A sealant layer is formed to cover the insulating layer, the light emitting layer, the metal cathode layer, and the transparent anode layer. A covering layer is provided. The covering layer covers a portion of the sealant layer above the metal cathode layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The invention particularly employs a vacuum evaporation process to deposit chemical active materials, such as active metal, onto a covering layer of a light emitting device to form an active absorption layer. As the covering layer covers over the metal cathode of the light emitting device, the active absorption layer can absorb invading water or oxygen, so as to avoid the erosion on the metal cathode and then prolong the lifetime of the product. In the invention, the evaporation process used to for the absorption layer has rendered several features, One is that the material suitable for use in evaporation is usually hydrophilic and can absorb water or oxygen. As a result, the active absorption layer formed by evaporation process naturally has the property to absorb water or oxygen.

Moreover, the invention has also employed an insulating layer, formed on the metal cathode before it is packaged. In this manner, even though the absorption is not included, the insulating layer, due to the direct contact on the metal cathode, can also effectively isolate from water or oxygen. Several examples are provided in the following for describing the features of the invention.

Figure 1:
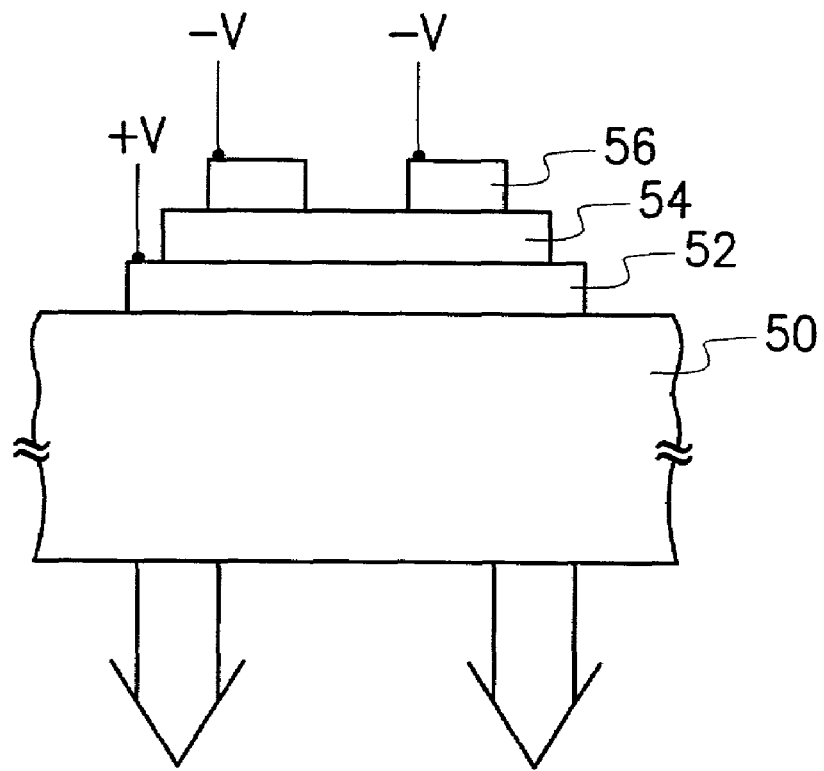
FIG. 1 is a cross-sectional drawing, schematically illustrating a structure of a conventional LED device.
Figure 2:
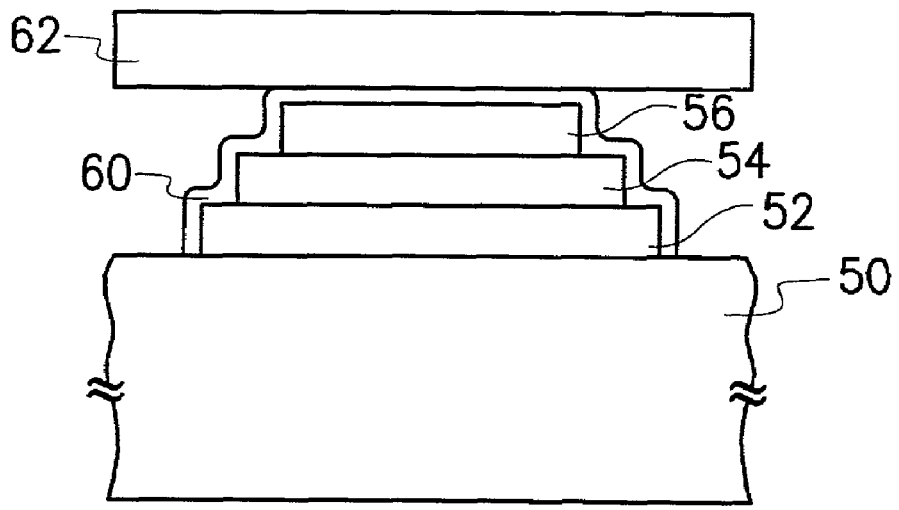
FIG. 2 is a cross-sectional drawing, schematically illustrating a packaging structure.
Figure 3A:
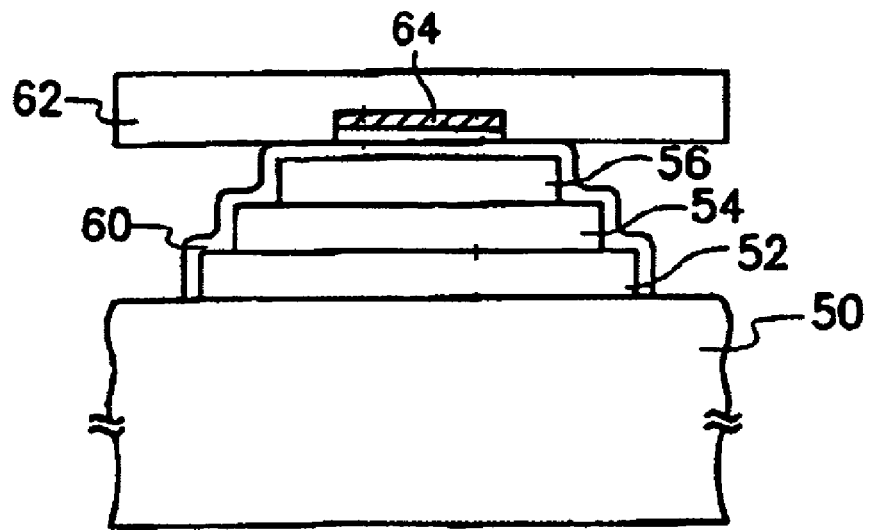
FIGS. 3A–3B are cross-sectional drawings, schematically illustrating a packaging structure of an LED, according to a preferred embodiment of the invention.
Figure 3B:
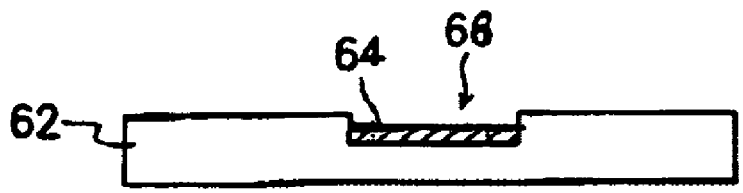

FIGS. 3A–3B are cross-sectional drawings, schematically illustrating a packaging structure of an LED, according to a preferred embodiment of the invention. In FIG. 3A, like to FIG. 2, the LED device includes a transparent substrate 50, on which a transparent anode layer 52, such as indium tin oxide (ITO), is formed. An LED material layer 54 is formed on the transparent anode layer 52. A metal cathode layer 56 is formed on the LED material layer 54. A sealant layer 60 covers the transparent anode layer 52, the LED material layer 54, and the metal cathode layer 56. Then, a covering layer 62 covers a portion of the sealant layer 60 above the metal cathode layer 56. The covering layer 62 has an active absorption layer 64 above the metal cathode layer 56. The active absorption layer 64 has at least the properties of absorbing water or oxygen, whereby the invading water or oxygen is isolated, and the reaction of water or oxygen with the metal cathode layer 56 is avoided. The active absorption layer 64 includes, for example, Ca, Mg, or Li. In addition, the recess region 66 can prevent the active absorption layer 64 from direct contacting on the sealant layer 60.

The formation of the active absorption layer 64 is shown in FIG. 3B. In FIG. 3B, the covering layer 62 has a recess region 66 formed at the predetermined location by, for example, photolithographic and etching processes in semiconductor fabrication. Then a vacuum evaporation process is performed to evaporate the chemical active absorbing material onto the recess region 66, thereby to form the active absorption layer 64. Here, the use of evaporation process is one of features in the invention, since the evaporation process has automatically ensure the material having ability to absorb water or oxygen. That is the material suitable for use in evaporation process intrinsically has properties of absorbing water or oxygen. The evaporation process has effectively simplified the fabrication consideration.

Figure 4:
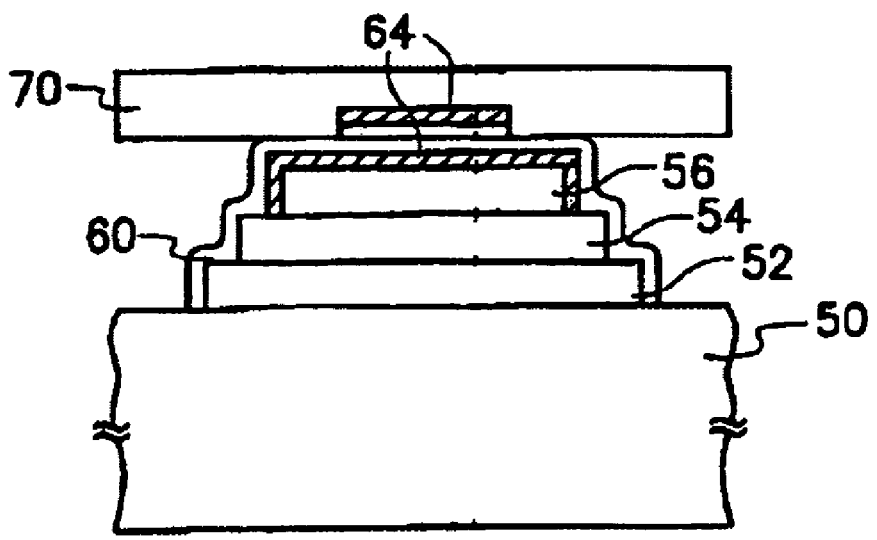
FIG. 4 is a cross-sectional drawing, schematically illustrating a packaging structure of an LED, according to another preferred embodiment of the invention.

Further still, FIG 4 is a cross-sectional drawing, schematically illustrating a packaging structure of an LED, according to another preferred embodiment of the invention. In FIG 4, a covering layer 70 can be like the covering layer 62 in FIG 3B, or alternatively a covering layer 70 is not necessary to have the active absorption layer. However, before the sealant layer 60 is formed, an active absorption layer 64 is evaporated beforehand to at least cover the metal cathode layer 56. The active absorption layer 64 may also cover the other portions, such as the transparent anode layer 52 and the LED material Layer 54.

Figure 5A:
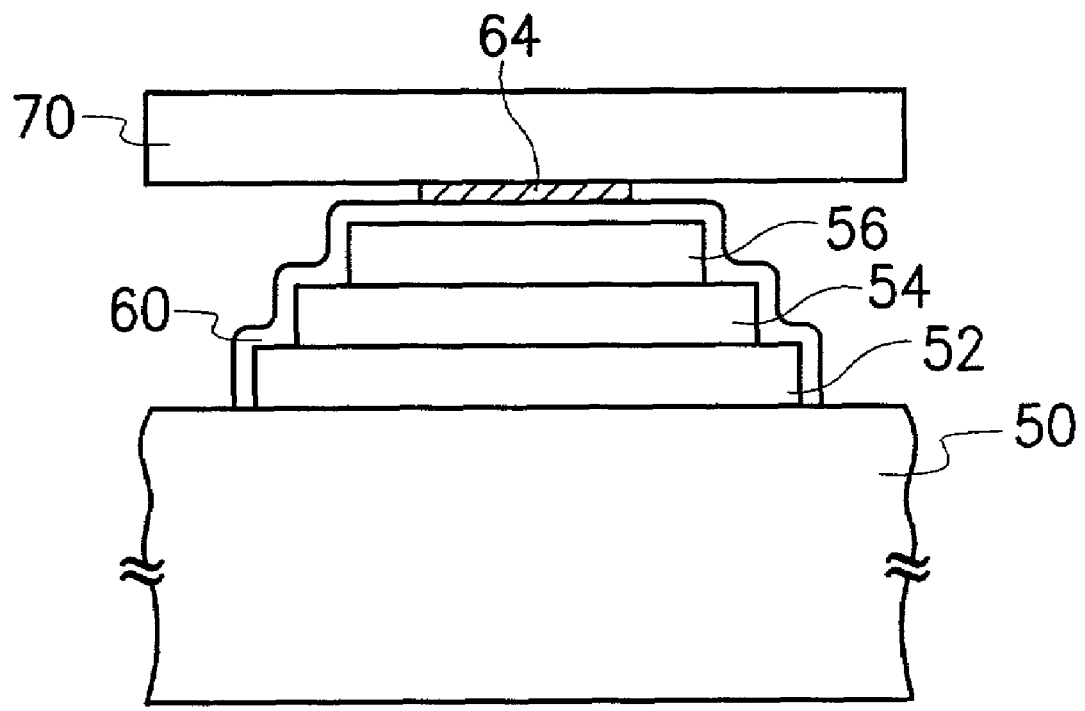
FIGS. 5A–5B are cross-sectional drawings, schematically a packaging structure of an LED, according to another preferred embodiment of the invention.
Figure 5B:
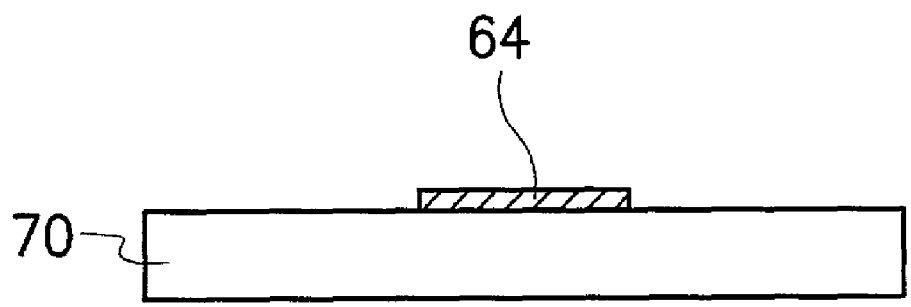

FIG. 5A–5B are cross-sectional drawings, schematically a packaging structure of an LED, according to another prefened embodiment of the invention. It is similar to the structure as shown in FIGS. 3A–3B, but the difference is that the covering layer 70 also does not need a recess region. Instead, the active absorption layer 64 is evaporated on the covering layer 70. As the covering layer covers over the sealant layer 60, the active absorption layer 64 directly contacts on the sealant layer 60.

Figure 6A:
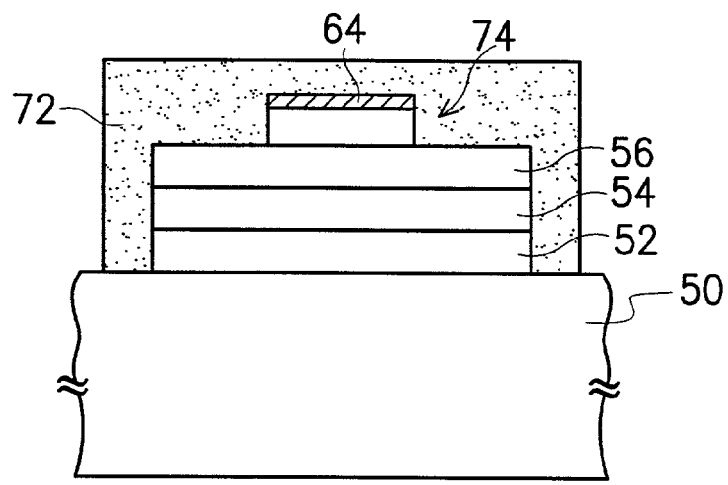
FIGS. 6A–6B are cross-sectional drawings, schematically a packaging structure of an LED, according to still another preferred embodiment of the invention.
Figure 6B:
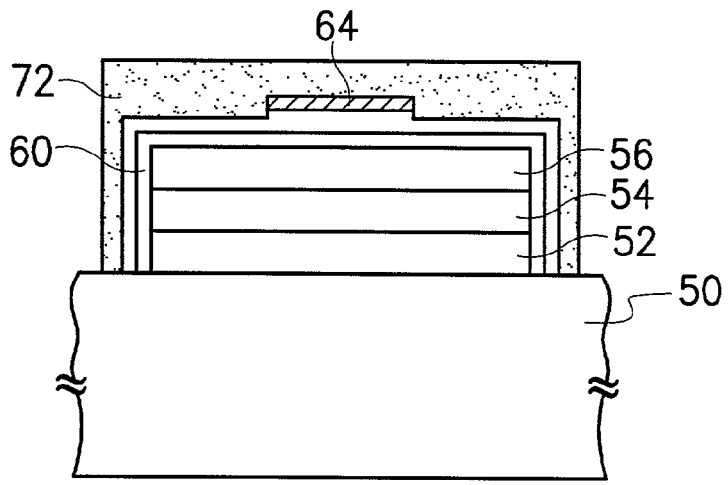

FIGS. 6A–6B are cross-sectional drawings, schematically a packaging structure of an LED, according to still another preferred embodiment of the invention. In FIG. 6A, the covering layer 72 has a cap-like structure. The cap-like covering layer 72 can, for example, tightly covers the device elements on the transparent substrate. However, there is a recess region 74 on the cap-like covering layer 72, with respect to the metal cathode layer 56. An absorption layer 64 is formed within the recess region 74. Alternatively as shown in FIG. 6B, the cap-like covering layer 72 is not tightly covering the device elements and leave a clearance. In this situation, the sealant layer 60 is formed to cover the device elements on the transparent substrate.

Figure 7:
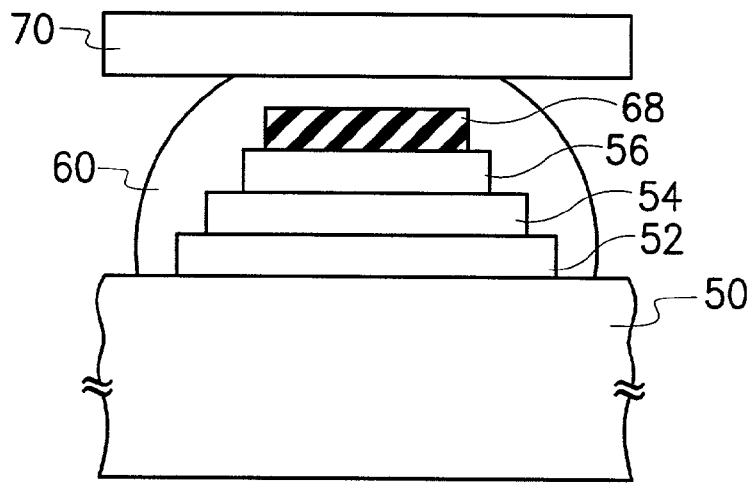
FIG. 7 is cross-sectional drawing, schematically a packaging structure of an LED, according to still yet another preferred embodiment of the invention.

FIG. 7 is cross-sectional drawing, schematically a packaging structure of an LED, according to still yet another preferred embodiment of the invention. In FIG. 7, before the sealant layer 60 is formed, an insulating layer 68 can be formed to cover the metal cathode layer 56. Then, the sealant layer 60 is formed afterward. The covering layer 70, as previously described, covers on the sealant layer 60. There is no need to form an active absorption layer on the covering layer 70. In other words, the method as shown in FIG. 7 does not need the active absorption layer. Instead, the insulation layer 68 directly covers the metal cathode layer 56, also resulting in prevention from contact with invading water or oxygen. Thereby, the insulating layer can also protect the metal cathode layer 56 from reacting with water or oxygen.

Figure 8:
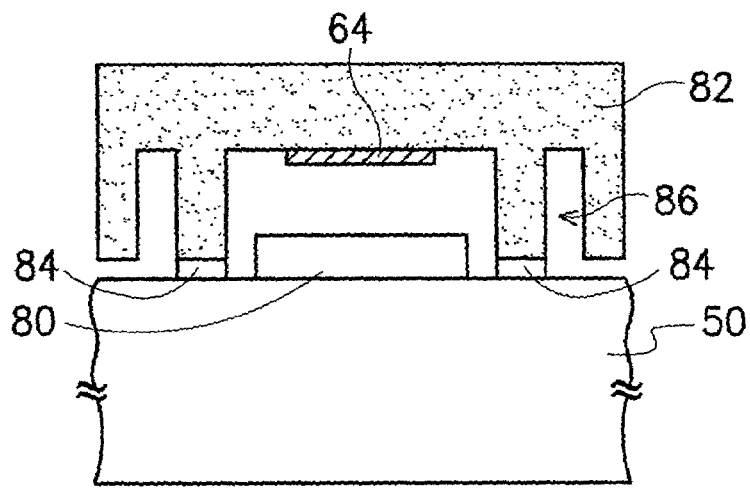
FIG. 8 is cross-sectional drawing, schematically a packaging structure of an LED, according to still yet another preferred embodiment of the invention.

According to the invention, the covering layer can also be designed with various structure. FIG. 8 is cross-sectional drawing, schematically a packaging structure of an LED, according to still yet another preferred embodiment of the invention. The structure shown in FIG. 8 includes a substrate 50. A light emitting device 80 is formed on the substrate 50. The light emitting device 80 at least includes the transparent anode layer 52, the LED material layer 54, and the metal cathode layer 56 as previously described. Moreover, a sealant can also be included. In this embodiment, the difference is the structure of the covering layer 82. As the covering layer 82 is etched to form the recess region, the outer peripheral region of the device is also etched to form a trench 86. Likewise, an active absorption layer 64 is also formed within the recess region, for example, at the bottom portion. Another sealant layer 84 is coating on the covering layer 82, locating a portion between the recess region and the trench 86. Then the covering layer can be glued onto the substrate 50. Since the formation of the trench 86, the trench 86 can prevent the sealant from overflowing outward to the covering layer 84 during coating the sealant. If the sealant overflows outward outside of the device, when the device is finally cut, the edge would not be tidily cut, and even would cause damage of the device.

In the foregoing, the etching process on the covering layer, preferably, includes a sand jet process, which uses particles of aluminum oxide as the etchant to bombard the covering layer.

Figure 9A:
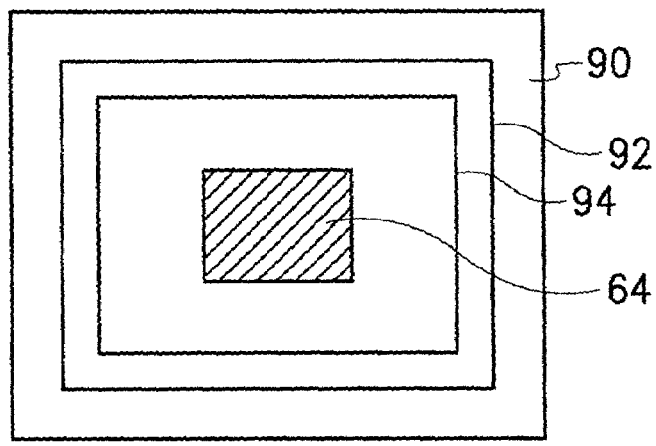
FIG. 9A is bottom view drawing, schematically a packaging structure of an LED, according to still yet another preferred embodiment of the invention.
Figure 9B:
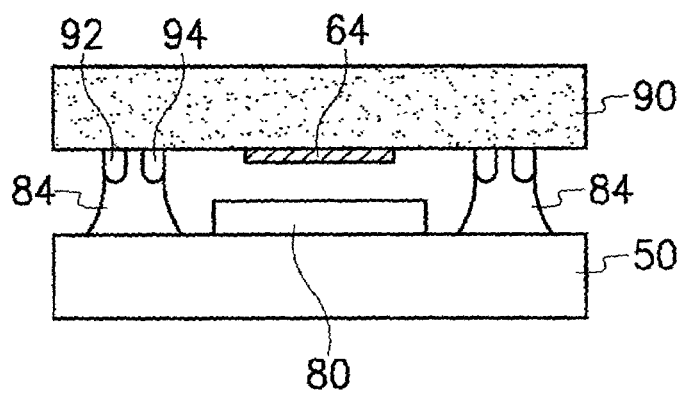
FIG. 9B is a cross-sectional drawing with respect to FIG. 9A.

Further still, FIG. 9A is, bottom view drawing, schematically a packaging structure of an LED, according to still yet another preferred embodiment of the invention. FIG. 9B is a cross-sectional drawing with respect to FIG. 9A. In FIG. 9A, an active absorption layer 64 is formed on the covering layer 90 at the predetermined location with respect to the light emitting device 80. Similarly to FIG. 8, this embodiment needs no the etching process. Instead, an inner flit line 94 and an outer flit line 92 are coated at the peripheiy of the active absorption layer 64, in which there is a proper clearance between the inner and the outer frit lines.

In FIG. 9B, as the covering layer 90 covers over the light emitting device 80 on the substrate 50, sealant can be properly injected into the clearance between the frit lines 92 and 94. The sealant 84 can be dropped to the clearance between the flit lines 92 and 94 with proper amount. This can also effectively prevent sealant from be overflowed outside. In this embodiment, the sealant and the flit lines also produce the needed space to cover the light emitting device 80.

In the foregoing, the invention can effectively prevent the metal cathode from reacting with invading water or oxygen, and thereby prolong the lifetime of the product. The method is simple also. Several advantages are as follows:

1. The invention employs evaporation process to form an active absorption layer. Since the evaporation process is very suitable for materials that can absorb water or oxygen, such as Mg, Li, or Ca, the active absorption layer can be easily formed on the covering layer.

2. The invention forms the active absorption layer as a part of the covering layer, where there is recess region so that the active absorption layer is not necessary to directly contact on the sealant layer.

3. The invention forms the active absorption layer associating a cap-like covering layer. The cap-like covering can further protect the device.

4. The invention uses an insulating layer, directly formed over the metal cathode 56. There is no of an active absorption layer.

5. In addition, during etching the covering layer, a trench is also formed at the outer periphery of the device, so that exudation of sealant is avoided, and then the damage of the device during cutting process is also avoided.

6. In addition, two close frit lines are formed at the peripheral region of the covering layer. By using the clearance of the frit lines in accordance with the amount of the sealant filled in the clearance, the covering layer adheres on the substrate, so as to protect the light emitting device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a light emitting device, the method comprising:

providing a covering layer;

providing a light emitting unit, wherein the method for forming the light emitting unit comprises:
  providing a transparent substrate, wherein a transparent anode layer, a light emitting layer, and a metal cathode layer are sequentially formed on the substrate; and
  forming a sealant layer, at least covering the light emitting layer and the metal cathode layer;
forming a recess region on a covering surface of the covering layer;
performing an evaporation depositing process, to form an active gas-moisture absorption layer on the recess region of the covering surface of the covering layer; and
putting the covering layer with the covering surface having the active gas-moisture absorption layer over at least a portion of the sealant layer above the metal cathode layer.

2. The method of claim 1, wherein the metal cathode layer comprises one selected from the group consisting of Li, Mg, and Ca.

3. The method of claim 1, wherein the active gas-moisture absorption layer comprises one selected from the group consisting of Li, Mg, and Ca.

4. The method of claim 1, wherein in the step of providing the covering layer, the covering layer comprises a cap-like layer to completely cover over the sealant layer, the transparent anode layer, light emitting layer, and the metal cathode layer.

5. The method of claim 1, wherein in the step of performing the evaporation depositing process, the active gas-moisture absorption layer is formed on a recessed surface of the recess region.

6. The method of claim 4, wherein further comprises a clearance between the cap-like covering layer and the sealant layer.

7. A method for forming a light emitting device, the method comprising:
  providing a covering layer;
  providing a light emitting unit, wherein the method for forming the light emitting unit comprises:
    providing a transparent substrate, wherein a transparent anode layer, a light emitting layer and the metal cathode layer are sequentially formed on the substrate;
    forming a sealant layer, at least covering the metal cathode layer;
  etching the covering layer to form a recess region on the covering layer at a covering surface with respect to the metal cathode layer, and forming a trench enclosing the recess region;
performing an evaporation depositing process, to form an active gas-moisture absorption layer on the covering layer within the recess region;
coating a gluing layer on a portion of the covering layer between the trench and the recess region; and
putting the covering layer with the covering surface having the active gas-moisture absorption layer over at least a portion of the light emitting unit above the metal cathode layer through adhering the covering layer onto the transparent substrate.

8. The method of claim 7, wherein the step of etching covering layer comprises performing a sand-jet etching process.

9. The method of claim 8, wherein the step of etching covering layer comprises performing a sand-jet etching process with etchant of aluminum oxide particles.

10. The method of claim 7, wherein the metal cathode layer comprises one selected from the group consisting of Li, Mg, and Ca.

11. The method of claim 7, wherein the active gas-moisture absorption layer comprises one selected from the group consisting of Li, Mg, and Ca.

12. The method of claim 7, wherein in the step of performing the evaporation depositing process, the active gas-moisture absorption layer is formed on a recessed surface of the recess region.

13. A method for forming a light emitting device, the method comprising:
  providing a covering layer;
  providing a light emitting unit, wherein the method of forming the light emitting unit comprises:
    providing a transparent substrate, wherein a transparent anode layer, a light emitting layer and a metal cathode layer are sequentially formed on the substrate;
    forming two frit lines on the covering layer, enclosing the active gas-moisture absorption layer, wherein a clearance between the two frit lines is reserved;
  performing an evaporation depositing process, to form an active gas-moisture absorption layer on the covering surface of the covering layer;
  properly dripping a sealant material on the clearance; and
  adhering the covering layer on the transparent substrate layer through the sealant material, wherein the active gas-moisture absorption layer is above the metal cathode layer.

14. The method of claim 13, wherein the metal cathode layer comprises one selected from the group consisting of Li, Mg, and Ca.

15. The method of claim 13, wherein the active gas-moisture absorption layer comprises one selected from the group consisting of Li, Mg, and Ca.

* * * * *